US006876130B2

(12) United States Patent
Wong et al.

(10) Patent No.: US 6,876,130 B2
(45) Date of Patent: Apr. 5, 2005

(54) DAMPED LONGITUDINAL MODE LATCHING RELAY

(75) Inventors: Marvin Glenn Wong, Woodland Park, CO (US); Arthur Fong, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 172 days.

(21) Appl. No.: 10/412,914

(22) Filed: Apr. 14, 2003

(65) Prior Publication Data

US 2004/0201329 A1 Oct. 14, 2004

(51) Int. Cl.[7] ........................ H01L 41/08; H01H 57/00; H01H 29/00

(52) U.S. Cl. .................. 310/328; 310/323.17; 200/182; 200/214; 200/215; 335/47; 335/49; 335/58

(58) Field of Search ............................ 310/323.17, 328; 200/182, 214, 215; 335/47, 49, 335

(56) References Cited

U.S. PATENT DOCUMENTS

| | | | | |
|---|---|---|---|---|
| 6,323,447 B1 | | 11/2001 | Kondoh et al. | |
| 6,373,356 B1 | | 4/2002 | Gutierrez et al. | |
| 6,512,322 B1 | | 1/2003 | Fong et al. | |
| 6,515,404 B1 | | 2/2003 | Wong | |
| 6,765,161 B1 | * | 7/2004 | Wong et al. | 200/182 |
| 6,768,068 B1 | * | 7/2004 | Wong et al. | 200/182 |
| 2003/0207102 A1 | * | 11/2003 | Fong et al. | 428/328 |
| 2004/0201310 A1 | * | 10/2004 | Wong et al. | 310/328 |
| 2004/0201317 A1 | * | 10/2004 | Wong | 310/328 |
| 2004/0201330 A1 | * | 10/2004 | Fong et al. | 310/365 |

FOREIGN PATENT DOCUMENTS

| | | |
|---|---|---|
| EP | 0593836 A1 | 10/1992 |
| FR | 2418539 A | 9/1979 |
| FR | 2458138 A1 | 10/1980 |
| FR | 2667396 | 9/1990 |
| JP | 36-18575 | 10/1961 |
| JP | 47-21645 | 10/1972 |
| JP | 63-276838 | 5/1987 |
| JP | 01-294317 | 5/1988 |
| JP | 08-125487 A | 5/1996 |
| JP | 9161640 | 6/1997 |
| WO | WO 99/46624 A1 | 9/1999 |

OTHER PUBLICATIONS

Jonathan Simon, "A Liquid–Filled Microrelay With A Moving Mercury Microdrop" (Sep. 1997), Journal of Microelectromechinical Systems, vol. 6, No. 3. pp. 208–216.

Marvin Glenn Wong, "A Piezoelectrically Actuated Liquid Metal Switch", May 2, 2002, patent application (pending, 12 pages of specification, 5 pages of claims, 1 page of abstract, and 10 sheets of drawings (Figs. 1–10).

Bhedwar, Homi C. et al. "Ceramic Multilayer Package Fabrication." Electronic Materials Handbook, Nov. 1989, pp. 460–469, vol. 1 Packaging, Section 4: Packages.

"Integral Power Resistors for Aluminum Substrate." IBM Technical Disclosure Bulletin, Jun. 1984, US, Jun. 1, 1984, p. 827, vol. 27, No. 1B, TDB–ACC–NO: NB8406827, Cross Reference: 0018–8689–27–1B–827.

Kim, Joonwon et al. "A Micromechanical Switch with Electrostatically Driven Liquid–Metal Droplet." Sensors and Actuators, A: Physical. v 9798, Apr. 1, 2002, 4 pages.

* cited by examiner

*Primary Examiner*—Thomas M. Dougherty

(57) ABSTRACT

A piezoelectric relay is disclosed in which a solid slug moves within a switching channel formed in relay housing. An electrical circuit passing between fixed contact pads in the switching channel is completed or broken by motion of the solid slug. Motion of the solid slug is controlled by at least two piezoelectric actuators within the switching channel. Motion of the solid slug is resisted by an electrically conductive liquid, such as a liquid metal, that wets between the solid slug and the contact pad in the switching channel. The surface tension of the, liquid provides a latching mechanism for the relay.

11 Claims, 3 Drawing Sheets

DAMPED LONGITUDINAL MODE LATCHING RELAY

CROSS REFERENCE TO RELATED APPLICATIONS

This application is related to the following co-pending U.S. Patent Applications, being identified by the below enumerated identifiers and arranged in alphanumerical order, which have the same ownership as the present application and to that extent are related to the present application and which are hereby incorporated by reference:

Application titled "Piezoelectrically Actuated Liquid Metal Switch", filed May 2, 2002 and identified by Ser. No. 10/137,691;

Application Ser. No. 10/413,068, "Bending Mode Latching Relay", and having the same filing date as the present application;

Application Ser. No. 10/412,912, "High Frequency Bending Mode Latching Relay", and having the same filing date as the present application;

Application titled "Piezoelectrically Actuated Liquid Metal Switch", filed May 2, 2002 and identified by Ser. No. 10/142,076;

Application Ser. No. 10/412,991, "High-frequency, Liquid Metal, Latching Relay with Face Contact", and having the same filing date as the present application;

Application Ser. No. 10/413,195, "Liquid Metal, Latching Relay with Face Contact", and having the same filing date as the present application;

Application Ser. No. 10/412,824, "Insertion Type Liquid Metal Latching Relay", and having the same filing date as the present application;

Application Ser. No. 10/413,278, "High-frequency, Liquid Metal, Latching Relay Array", and having the same filing date as the present application;

Application Ser. No. 10/412,880, "Insertion Type Liquid Metal Latching Relay Array", and having the same filing date as the present application;

Application Ser. No. 10/413,267, "Liquid Metal Optical Relay", and having the same filing date as the present application;

Application titled "A Longitudinal Piezoelectric Optical Latching Relay", filed Oct. 31, 2001 and identified by Ser. No. 09/999,590;

Application Ser. No. 10/413,314, "Shear Mode Liquid Metal Switch", and having the same filing date as the present application;

Application Ser. No. 10/413,328, "Bending Mode Liquid Metal Switch", and having the same filing date as the present application;

Application Ser. No. 10/413,251, titled "A Longitudinal Mode Optical Latching Relay", and having the same filing date as the present application;

Application Ser. No. 10/413,098, "Method and Structure for a Pusher-Mode Piezoelectrically Actuated Liquid Metal Switch", and having the same filing date as the present application;

Application Ser. No. 10/412,895, "Method and Structure for a Pusher-Mode Piezoelectrically Actuated Liquid Metal Optical Switch", and having the same filing date as the present application;

Application titled "Switch and Production Thereof", filed Dec. 12, 2002 and identified by Ser. No. 10/317,597;

Application Ser. No. 10/413,237, "High Frequency Latching Relay with Bending Switch Bar", and having the same filing date as the present application;

Application Ser. No. 10/413,099, "Latching Relay with Switch Bar", and having the same filing date as the present application;

Application Ser. No. 10/413,100, "High Frequency Push-mode Latching Relay", and having the same filing date as the present application;

Application Ser. No. 10/413,067, "Push-mode Latching Relay", and having the same filing date as the present application;

Application Ser. No. 10/412,857, "Closed Loop Piezoelectric Pump", and having the same filing date as the present application;

Application titled "Solid Slug Longitudinal Piezoelectric Latching Relay", filed May 2, 2002 and identified by Ser. No. 10/137,692;

Application Ser. No. 10/412,869, "Method and Structure for a Slug Pusher-Mode Piezoelectrically Actuated Liquid Metal Switch", and having the same filing date as the present application;

Application Ser. No. 10/412,916, "Method and Structure for a Slug Assisted Longitudinal Piezoelectrically Actuated Liquid Metal Optical Switch", and having the same filing date as the present application;

Application Ser. No. 10/413,070, "Method and Structure for a Slug Assisted Pusher-Mode Piezoelectrically Actuated Liquid Metal Optical Switch", and having the same filing date as the present application;

Application Ser. No. 10/413,094, "Polymeric Liquid Metal Switch", and having the same filing date as the present application;

Application Ser. No. 10/412,859, "Polymeric Liquid Metal Optical Switch", and having the same filing date as the present application;

Application Ser. No. 10/412,868, "Longitudinal Electromagnetic Latching Optical Relay", and having the same filing date as the present application;

Application Ser. No. 10/413,329, "Longitudinal Electromagnetic Latching Relay", and having the same filing date as the present application;

Application Ser. No. 10/412,894, "Damped Longitudinal Mode Optical Latching Relay", and having the same filing date as the present application;

Application titled "Switch and Method for Producing the Same", filed Dec. 12, 2002 and identified by Ser. No. 10/317,963;

Application titled "Piezoelectric Optical Relay", filed Mar. 28, 2002 and identified by Ser. No. 10/109,309;

Application titled "Electrically Isolated Liquid Metal Micro-Switches for Integrally Shielded Microcircuits", filed Oct. 8, 2002 and identified by Ser. No. 10/266,872;

Application titled "Piezoelectric Optical Demultiplexing Switch", filed Apr. 10, 2002 and identified by Ser. No. 10/119,503;

Application titled "Volume Adjustment Apparatus and Method for Use", filed Dec. 12, 2002 and identified by Ser. No. 10/317,293;

Application Ser. No. 10/413,002, "Method and Apparatus for Maintaining a Liquid Metal Switch in a Ready-to-Switch Condition", and having the same filing date as the present application;

Application Ser. No. 10/412,858, titled "A Longitudinal Mode Solid Slug Optical Latching Relay", and having the same filing date as the present application;

Application Ser. No. 10/413,270, titled "Reflecting Wedge Optical Wavelength Multiplexer/Demultiplexer", and having the same filing date as the present application;

Application Ser. No. 10/413,088, "Method and Structure for a Solid Slug Caterpillar Piezoelectric Relay", and having the same filing date as the present application;

Application Ser. No. 10/413,196, titled "Method and Structure for a Solid Slug Caterpillar Piezoelectric Optical Relay", and having the same filing date as the present application;

Application Ser. No. 10/413,187, "Inserting-finger Liquid Metal Relay", and having the same filing date as the present application;

Application Ser. No. 10/413,058, "Wetting Finger Liquid Metal Latching Relay", and having the same filing date as the present application;

Application Ser. No. 10/412,874, "Pressure Actuated Optical Latching Relay", and having the same filing date as the present application;

Application Ser. No. 10/413,162, "Pressure Actuated Solid Slug Optical Latching Relay", and having the same filing date as the present application; and Application Ser. No. 10/412,910, "Method and Structure for a Slug Caterpillar Piezoelectric Reflective Optical Relay", and having the same filing date as the present application.

FIELD OF THE INVENTION

The invention relates to the field of electrical switching relays, and in particular to a piezoelectrically actuated relay that latches by means of liquid surface tension.

BACKGROUND

Liquid metals, such as mercury, have been used in electrical switches to provide an electrical path between two conductors. An example is a mercury thermostat switch, in which a bimetal strip coil reacts to temperature and alters the angle of an elongated cavity containing mercury. The mercury in the cavity forms a single droplet due to high surface tension. Gravity moves the mercury droplet to the end of the cavity containing electrical contacts or to the other end, depending upon the angle of the cavity. In a manual liquid metal switch, a permanent magnet is used to move a mercury droplet in a cavity.

Liquid metal is also used in relays. A liquid metal droplet can be moved by a variety of techniques, including electrostatic forces, variable geometry due to thermal expansion/contraction and magneto-hydrodynamic forces.

Conventional piezoelectric relays either do not latch or use residual charges in the piezoelectric material to latch or else activate a switch that contacts a latching mechanism.

Rapid switching of high currents is used in a large variety of devices, but provides a problem for solid-contact based relays because of arcing when current flow is disrupted. The arcing causes damage to the contacts and degrades their conductivity due to pitting of the electrode surfaces.

Micro-switches have been developed that use liquid metal as the switching element and the expansion of a gas when heated to move the liquid metal and actuate the switching function. Liquid metal has some advantages over other micro-machined technologies, such as the ability to switch relatively high powers (about 100 mW) using metal-to-metal contacts without micro-welding or overheating the switch mechanism. However, the use of heated gas has several disadvantages. It requires a relatively large amount of energy to change the state of the switch, and the heat generated by switching must be dissipated effectively if the switching duty cycle is high. In addition, the actuation rate is relatively slow, the maximum rate being limited to a few hundred Hertz.

SUMMARY

The present invention relates to an electrical switch in which a solid slug is moved within a channel to make or break an electrical circuit between contact pads in the channel. The solid slug is moved by piezoelectric elements. In an exemplary embodiment, the slug is wetted by an electrically conductive liquid, such as liquid metal, that also adheres to wettable metal contact pads within the channel to provide a latching mechanism. Motion of the solid slug may be damped to prevent damage.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
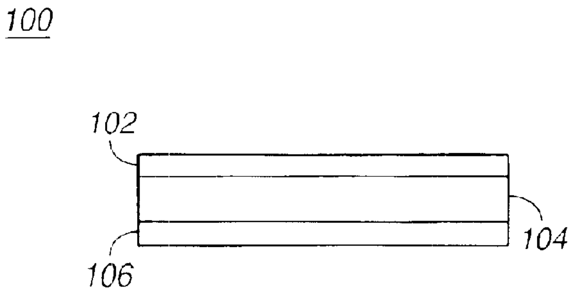
FIG. 1 is an end view of a relay in accordance with certain embodiments of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The present invention relates to a piezoelectrically actuated relay that switches and latches by means of a wettable solid slug and a liquid.

In an exemplary embodiment, the relay uses piezoelectric elements to displace a solid slug. Here, "solid" is meant as "non-liquid": the slug may be hollow. The slug makes or breaks an electrical circuit, allowing the switching of electrical signals. The solid slug is held in place by surface tension in a liquid, preferably a liquid metal such as mercury, that wets between the solid slug and at least one fixed contact pad on the relay housing. Magnetorestrictive actuators, such as Terfenol-D, that deform in the presence of a magnetic field may be used as an alternative to piezoelectric actuators. In the sequel, piezoelectric actuators and magnetorestrictive actuators will be collectively referred to as "piezoelectric actuators".

In one embodiment, micro-machining techniques are used to manufacture the relay. An end view of a relay 100 is shown in FIG. 1. In this embodiment, the body of the relay is made up of three layers and is amenable to manufacture by micro-machining. The lowest layer is a circuit substrate 106 that will be described in more detail below with reference to FIG. 6 and FIG. 7. The next layer is a switching layer 104. The switching of the electrical signal occurs in a switching channel contained in this layer. The switching layer also contains a pressure relief passage for relieving pressure variations in the switching channel. The cap layer 102 provides a cap for the switching channel.

Figure 2:
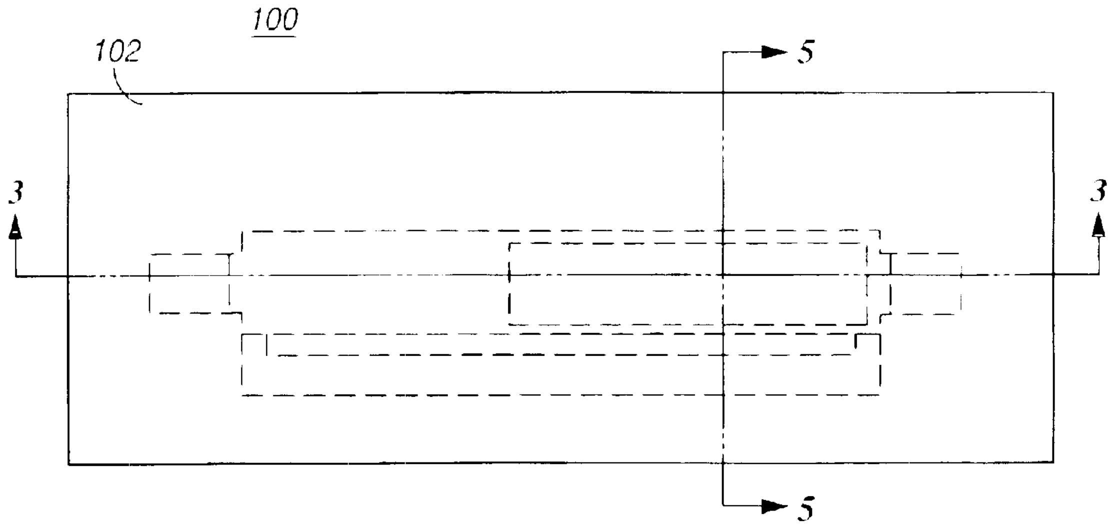
FIG. 2 is a top view of a relay in accordance with certain embodiments of the present invention.
Figure 3:
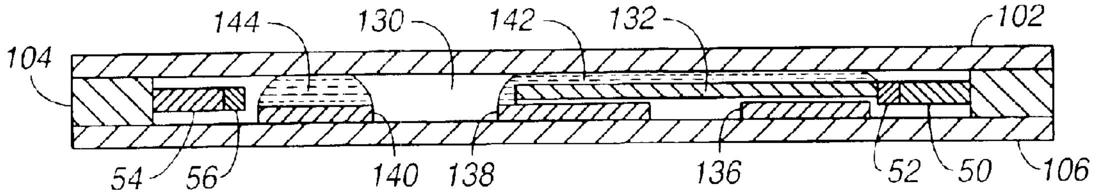
FIG. 3 is a sectional view through a relay in accordance with certain embodiments of the present invention.
Figure 5:
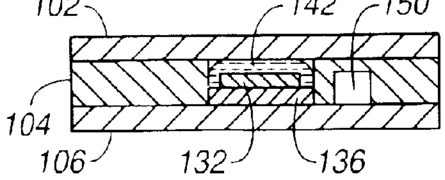
FIG. 5 is a still further sectional view through a relay in accordance with certain embodiments of the present invention.

FIG. 2 is a top view of a relay 100, showing the cap layer 102. The section 3-3 is shown in FIG. 3. The section 5—5 is shown in FIG. 5.

FIG. 3 is a sectional view through the section 3—3 of the relay shown in FIG. 2 is shown in. A switching channel 130 is formed in the switching layer 104. A solid slug 132 is moveably positioned within the switching channel. Three electrical contact pads 136, 138 and 140 are fixed to the circuit substrate 106 within the switching channel. These contact pads may be formed on the circuit substrate 106 by deposition or other micro-machining techniques. The contact pads are wettable by a liquid, such as a liquid metal. When the solid slug 132 is positioned as shown in FIG. 3, an electrically conducting liquid 142 wets the surface of the solid slug and the surface of the contact pads 136 and 138. Surface tension holds the solid slug in this position. Additional liquid 144 wets the contact pad 140.

Piezoelectric elements 50 and 54 are attached to the substrate of the switching layer 104. Electrical connections (not shown) to the piezoelectric elements either pass along the top of the circuit substrate 106 to the edges of the relay or pass through holes or vias in the circuit substrate and connect to connection pads on the bottom of the relay.

Figure 4:
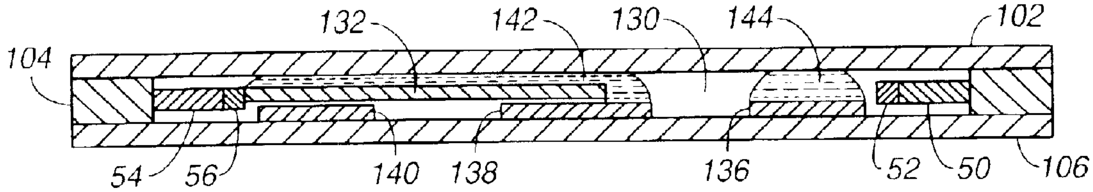
FIG. 4 is a further sectional view through a relay in accordance with certain embodiments of the present invention.

When the solid slug occupies the position shown in FIG. 3, the electrical circuit between contact pads 136 and 138 is completed by the slug and the liquid, while the electrical circuit between contact pads 140 and 138 is incomplete. In order to change the switch-state of the relay, the piezoelectric element 50 is energized by applying an electric potential across the element. This causes the piezoelectric element 50 to expand and apply an impulsive force to the end of the solid slug 132. The motion of the piezoelectric element is rapid and causes the imparted momentum of the solid slug to overcome the surface tension forces (from the liquid) that tends to hold it in contact with the contact pads near the actuating piezoelectric element. The surface tension latch is broken and the solid slug moves to the left end of the switching channel, as shown in FIG. 4. The solid slug 132 is then in wetted contact with the contact pads 138 and 140 and is latched in its new position. In this new position, the electrical circuit between contact pads 140 and 138 is completed by the slug and the liquid, while the electrical circuit between contact pads 136 and 138 is broken.

The switch-state may be changed back from the state shown in FIG. 4 to the original state shown in FIG. 3, by energizing the piezoelectric element 54 to move the solid slug. Once the solid slug has returned to its original position it is again latched into position by surface tension in the liquid.

In order to prevent the brittle piezoelectric elements from breaking when the switching slug arrives at its new locations during switching, energy dissipative elements are used to lessen the impact forces. In a first embodiment of the invention, shown in FIG. 3 and FIG. 4, compliant, energy absorptive faces 52 and 56 are used on the piezoelectric elements 50 and 54, respectively. Materials such as "Sorbothane" are effective at absorbing shock and vibration. An alternative embodiment is described below with reference to FIG. 6.

FIG. 5 is a sectional view of the relay through the section 5—5 shown in FIG. 2. The solid slug 132 rests on the contact pad 136 and is held in position by surface tension of the conducting liquid 142. A pressure relief passage 150 is coupled to the ends of the switching channel and allows fluid to flow from one end of the switching channel to the other.

Figure 6:
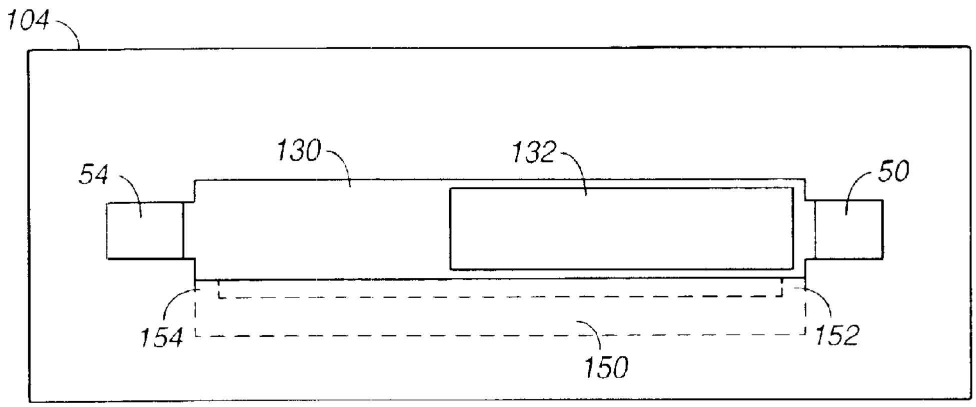
FIG. 6 is a top view of a switching layer of a relay with the cap layer removed in accordance with certain embodiments of the present invention.

FIG. 6 is a top view of the switching layer 104 of the second embodiment of the relay. A pressure relief channel 150 is coupled to the ends of the switching channel 130 by vent holes 152 and 154. The pressure relief channel 150 allows pressure variations in the switching channel, due to movement of the solid slug 132, to be equalized by allowing fluid to flow from one end of the switching channel to the other through the vent holes. When the actuator 50 pushes the slug 132 to actuate it, the actuator face pushes the slug to the level of the vent opening 152, relieving any vacuum between the actuator face and the end of the slug that would tend to hold the slug back. The slug preferably has shaped ends that are just wide enough to fit into the recesses in which actuators 50 & 54 reside. In the embodiment shown in FIG. 6, the energy absorptive faces 52 and 56 are absent and the switching channel is narrowed near the piezoelectric actuators so there is little clearance between the channel walls and the portion of the slug between the rest position of the piezoelectric actuator face and the vent opening. When the slug arrives, liquid metal is trapped between the slug and the actuator face and is squeezed through the opening surrounding the slug, thus providing damping. Various passage designs may be used to better control the flow of liquid metal and damping. One advantage of this method of damping is that there is minimal damping when the slug departs. Piezoelectric actuators 50 and 54 are attached to the switching layer 104 within the switching channel 130.

Figure 7:
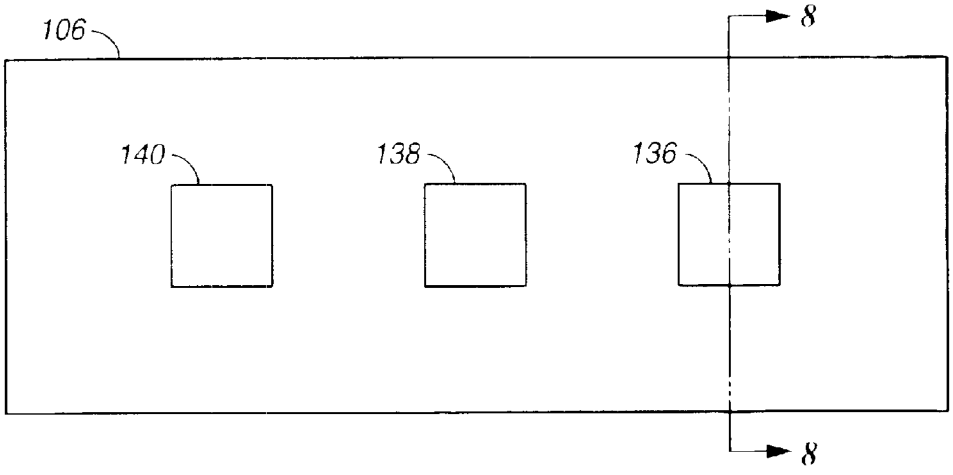
FIG. 7 is a view of circuit substrate of a relay in accordance with certain embodiments of the present invention.

FIG. 7 is a top view of the circuit substrate 106. Three contact pads 136, 138 and 140 are formed on top of the substrate. The surfaces of the contact pads are wettable by the liquid in the switching channel. The contact pads are preferably constructed of a wettable metal. In an exemplary embodiment, electrical circuitry is formed on the circuit substrate to allow for connection to the piezoelectric actuator.

Figure 8:
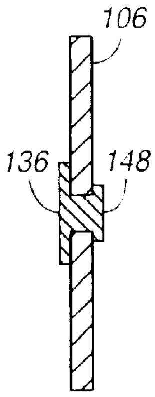
FIG. 8 is a sectional view through a circuit substrate of a relay in accordance with certain embodiments of the present invention.

FIG. 8 is a sectional view of the circuit substrate through the section CC shown in FIG. 7. In this embodiment, electrical connection 148 to the contact pad 136 passes through a hole in the circuit substrate 106. Similar connections are provided for the other contact pads. In an alternative embodiment, the electrical connections are deposited in the surface of the circuit substrate and terminate at the edges of the substrate.

The electrical relay of the present invention can be made using micro-machining techniques for small size. The switching time is short, yielding switching rates of several kHz or higher. Heat generation is also low, since the only heat generators are the piezoelectric element and the passage of control currents through the conductors to the piezoelectric elements.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A piezoelectric relay comprising:

a relay housing containing a switching channel;

a solid slug adapted to move within the switching channel;

a first contact pad located in the switching channel and having a surface wettable by a liquid;

a second contact pad located in the switching channel and having a surface wettable by a liquid;

a third contact pad located in the switching channel and having a surface wettable by a liquid;

an electrically conductive liquid volume in wetted contact with the solid slug;

a first piezoelectric actuator operable to impart an impulsive force to the solid slug to move the solid slug to a first position within the switching channel where it completes an electrical circuit between the first and second contact pads; and a second piezoelectric actuator operable to impart an impulsive force to the solid slug to move the solid slug to a second position within the switching channel where it completes an electrical circuit between the second and third contact pads.

2. A piezoelectric relay in accordance with claim 1, further comprising:

a pressure relief passage; and first and second pressure relief vents opening to and connecting the ends of the switching channel to the pressure relief passage and adapted to relieve pressure in the switching channel when the solid slug is moved.

3. A piezoelectric relay in accordance with claim 2, wherein the switching channel is narrowed in the vicinity of the first and second pressure relief vents to dampen motion of the solid slug.

4. A piezoelectric relay in accordance with claim 1, wherein the electrically conductive liquid is a liquid metal.

5. A piezoelectric relay in accordance with claim 1, further comprising:

a first compliant, energy absorptive facing attached to an end of the first piezoelectric actuator and positioned between the first piezoelectric actuator and the solid slug; and a second compliant, energy absorptive facing attached to an end of the second piezoelectric actuator and positioned between the second piezoelectric actuator and the solid slug.

6. A piezoelectric relay in accordance with claim 5, wherein the first and second compliant, energy absorptive facings are made of Sorbothane.

7. A piezoelectric relay in accordance with claim 1, wherein the relay housing comprises:

a circuit substrate supporting electrical connections to the first and second piezoelectric actuators and the first, second and third electrical contact pads;

a cap layer; and a switching layer, positioned between the circuit substrate layer and the cap layer, in which the switching channel is formed.

8. A piezoelectric relay in accordance with claim 7, wherein the relay housing further comprises:

a pressure relief passage formed in the switching layer; and first and second pressure relief vents connecting the ends of the switching channel to the pressure relief passage.

9. A method for switching an electrical circuit in a piezoelectric relay having solid slug that is wetted by a liquid metal and moveable within a switching channel, the method comprising:

coupling an input electrical signal to a first electrical contact pad;

if the electrical circuit is to be completed:

energizing a first piezoelectric actuator to move the solid slug to a first position, where it completes an electrical circuit between the first electrical contact pad and a second electrical contact pad; and if the electrical circuit is to be broken:

energizing a second piezoelectric actuator to move the solid slug to a second position, where it no longer completes an electrical circuit between the first electrical contact pad and second electrical contact pad.

10. A method for switching an electrical circuit in a piezoelectric relay in accordance with claim 9, wherein energizing the first piezoelectric actuator causes a face of the piezoelectric actuator to push the solid slug to align with a pressure relief vent opening, thereby relieving any vacuum between the face of piezoelectric actuator and the end of the slug.

11. A method for switching between a first electrical circuit and a second electrical circuit in a piezoelectric relay, the relay having a solid slug that is wetted by a liquid metal and moveable within a switching channel and the method comprising:

if the first electrical circuit is to be selected:

energizing a first piezoelectric actuator to move the solid slug to a first position, where it completes an electrical circuit between a first electrical contact pad and a second electrical contact pad; and if the second electrical circuit is to be selected:

energizing the second piezoelectric actuator to move the solid slug to a second position, where it completes an electrical circuit between the first electrical contact pad and a third electrical contact pad.

* * * * *